United States Patent [19]

Campanelli

[11] Patent Number: 5,000,811
[45] Date of Patent: Mar. 19, 1991

[54] PRECISION BUTTABLE SUBUNITS VIA DICING

[75] Inventor: Michael R. Campanelli, Webster, N.Y.

[73] Assignee: Xerox Corporation, N.Y.

[21] Appl. No.: 440,216

[22] Filed: Nov. 22, 1989

[51] Int. Cl.⁵ .................... B32B 31/00; B29C 65/00
[52] U.S. Cl. .................................. 156/264; 156/257; 156/304.1; 437/226
[58] Field of Search ............ 156/250, 257, 264, 304.1, 156/304.5; 437/226; 29/412, 415, 416; 346/1.1, 140 R; 83/875, 885, 39

[56] References Cited

U.S. PATENT DOCUMENTS

| | | | |
|---|---|---|---|
| 3,706,129 | 12/1972 | McCann | 437/226 X |
| 3,859,127 | 1/1975 | Lehner | 156/662 X |
| 3,895,429 | 7/1975 | Huang et al. | 437/227 X |
| 3,913,217 | 10/1975 | Misawa et al. | 437/227 X |
| 3,972,113 | 8/1976 | Nakata et al. | 357/56 X |
| 4,237,600 | 12/1980 | Rosen et al. | 29/577 |
| 4,237,601 | 12/1980 | Woolhouse et al. | 437/226 |
| 4,601,777 | 7/1986 | Hawkins et al. | 156/626 |
| 4,604,161 | 8/1986 | Araghi | 156/645 |
| 4,612,554 | 9/1986 | Poleshuk | 346/140 R |
| 4,774,530 | 9/1988 | Hawkins | 346/140 R |
| 4,786,357 | 11/1988 | Campanelli et al. | 156/633 |
| 4,789,425 | 12/1988 | Drake et al. | 156/644 |
| 4,814,296 | 3/1989 | Jedlicka et al. | 437/226 |

*Primary Examiner*—William A. Powell
*Attorney, Agent, or Firm*—Oliff & Berridge

[57] ABSTRACT

A buttable edge surface in a substrate is fabricated by sawing a back cut in a base surface of the substrate and then cutting a section cut through the upper surface of the back cut to intersect the back cut. The location of the section cut defines the buttable edge surface of the substrate. The section cut divides the substrate into a plurality of subunits which can be butted together to form an elongated array of butted subunits. The cutting blade preferably is a resinoid blade.

31 Claims, 5 Drawing Sheets

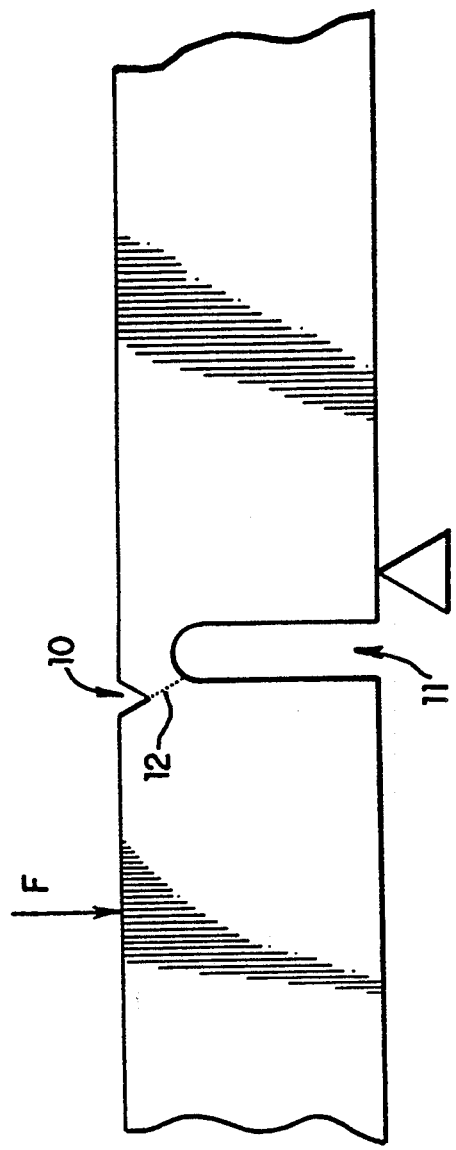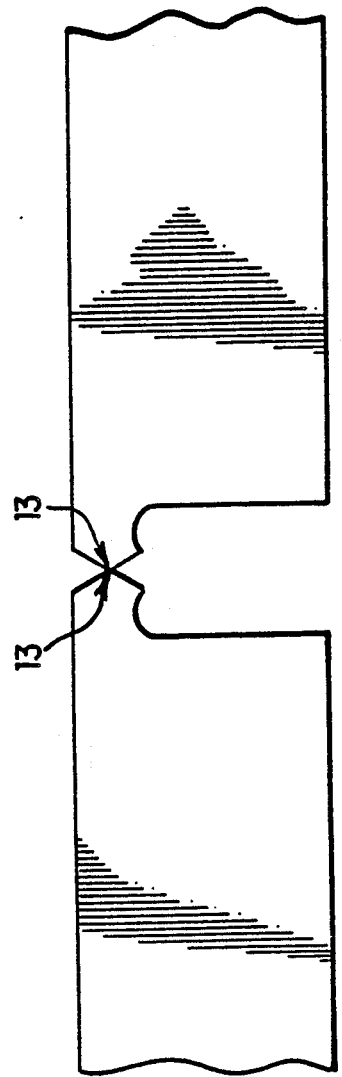

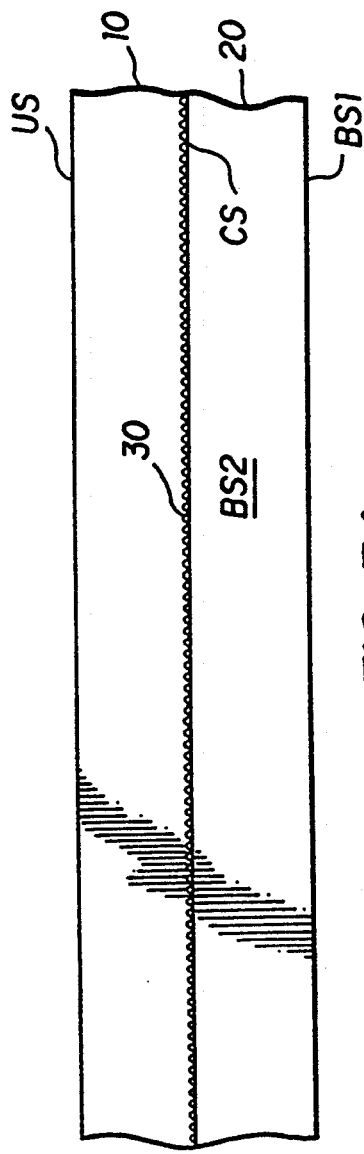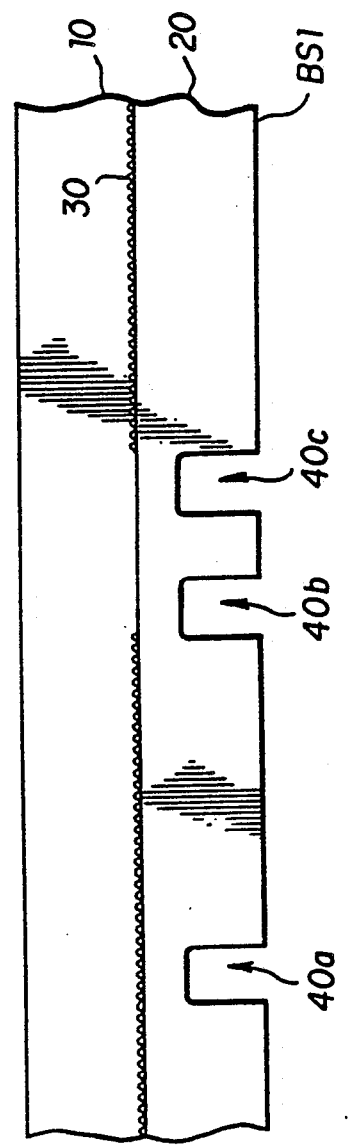

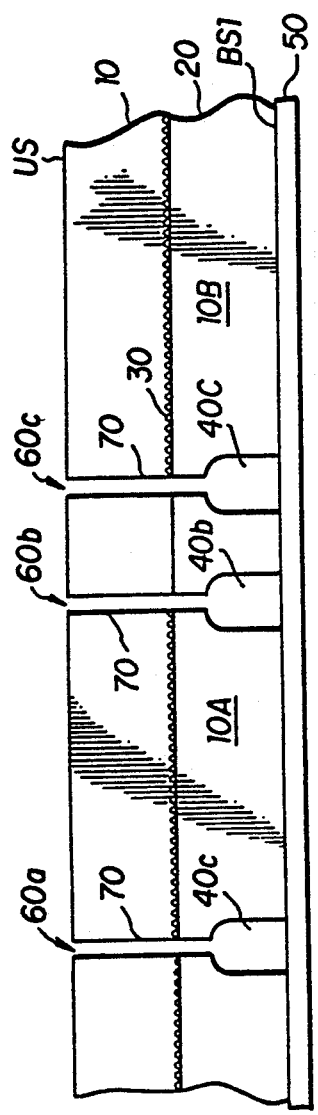
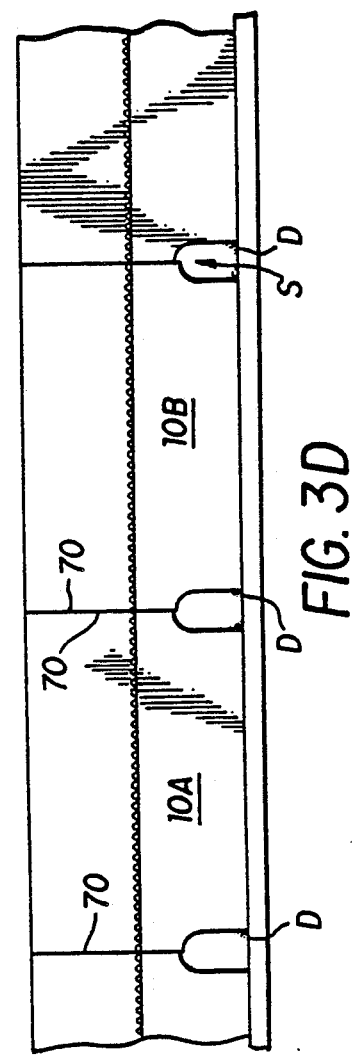

PRECISION BUTTABLE SUBUNITS VIA DICING

BACKGROUND OF THE INVENTION

1. Field of the Invention

The present invention involves a method of fabricating subunits having precision butt edge surfaces and particularly to a method of forming an ink jet printhead from a linear array of butted subunits, each subunit being manufactured with precision butt edge surfaces formed by dicing, preferably with a resinoid blade.

2. Description of Related Art

Thermal ink jet printing systems use thermal energy selectively produced by resistors located in capillary filled ink channels near channel terminating nozzles or orifices to vaporize momentarily the ink and form bubbles on demand. Each temporary bubble expels an ink droplet and propels it towards a recording medium. The printing system may be incorporated in either a carriage type printer or a pagewidth type printer. The carriage type printer generally has a relatively small printhead, containing the ink channels and nozzles. The printhead is usually sealingly attached to a disposable ink supply cartridge and the combined printhead and cartridge assembly is reciprocated to print one swath of information at a time on a stationarily held recording medium, such as paper. After the swath is printed, the paper is stepped a distance equal to the height of the printed swath, so that the next printed swath will be contiguous therewith. The procedure is repeated until the entire page is printed. For an example of a cartridge type printer, refer to U.S. Pat. No. 4,571,599 to Rezanka. In contrast, the pagewidth printer has a stationary printhead having a length equal to or greater than the width of the paper. The paper is continually moved past the pagewidth printhead in a direction normal to the printhead length and at a constant speed during the printing process. Refer to U.S. Pat. No. 4,463,359 to Ayata et al for an example of pagewidth printing and especially FIGS. 17 and 20 therein.

U.S. Pat. No. 4,463,359 mentioned above discloses a printhead having one or more ink filled channels which are replenished by capillary action. A meniscus is formed at each nozzle to prevent ink from weeping therefrom. A resistor or heater is located in each channel upstream from the nozzles. Current pulses representative of data signals are applied to the resistors to momentarily vaporize the ink in contact therewith and form a bubble for each current pulse. Ink droplets are expelled from each nozzle by the growth of the bubbles which causes a quantity of ink to bulge from the nozzle and break off into a droplet at the beginning of the bubble collapse. The current pulses are shaped to prevent the meniscus from breaking up and receding too far into the channels, after each droplet is expelled. Various embodiments of linear arrays of thermal ink jet devices are shown, such as those having staggered linear arrays attached to the top and bottom of a heat sinking substrate for the purpose of obtaining a pagewidth printhead. Such arrangements may also be used for different colored inks to enable multi-colored printing.

U.S. Pat. No. 4,612,554 to Poleshuk discloses an ink jet printhead composed of two parts, each having a set of parallel V-grooves anisotropically etched therein. The lands between the grooves each contain a heating element and its associated addressing electrodes. The grooved parts permit face-to-face mating, so that they are automatically self-aligned by the intermeshing of the lands containing the heating elements and electrodes of one part with the grooves of the other parts. A pagewidth printhead is produced by offsetting the first two mated parts, so that subsequently added parts abut each other and yet continue to be self-aligned.

U.S. Pat. No. 4,601,777 to Hawkins et al and U.S. Pat. No. 4,774,530 to Hawkins (the disclosures of which are herein incorporated by reference) disclose "side shooter" configurations for a thermal ink jet printhead and several fabricating processes therefor. Each printhead is composed of two parts aligned and bonded together. One part is a substantially flat substrate which contains on the surface thereof a linear array of heating elements and addressing electrodes, and a second part is a substrate having at least one recess anisotropically etched therein to serve as an ink supply manifold when the two parts are bonded together. A linear array of parallel grooves also are formed in the second part, so that one end of the grooves communicates with the manifold recess and the other ends are open for use as ink droplet expelling nozzles. Many printheads can be made simultaneously by producing a plurality of sets of heating arrays with their addressing electrodes on a silicon wafer and by placing alignment marks thereon at predetermined locations. A corresponding plurality of sets of channels and associated manifolds are produced in a second silicon wafer. In one embodiment, alignment openings are etched in the second silicon wafer at predetermined locations. The two wafers are aligned via the alignment openings and alignment marks, then bonded together and diced into many separate printheads.

U.S. Pat. No. 4,789,425 to Drake et al. (the disclosure of which is herein incorporated by reference), discloses a thermal ink jet printhead of the type which expels droplets on demand towards a recording medium from nozzles located above and generally parallel with the bubble generating heating elements contained therein. The droplets are propelled from nozzles located in the printhead roof along trajectories that are perpendicular to the heating element surfaces. Such a configuration is sometimes referred to as a "roofshooter". Each printhead comprises a silicon heater plate and a fluid directing structural member. The heater plate has a linear array of heating elements, associated addressing elements, and an elongated ink fill hole parallel to and adjacent the heating element array. A structural member contains at least one recessed cavity, a plurality of nozzles, and a plurality of parallel walls within the recessed cavity which define individual ink channels for directing ink to the nozzles. The recessed cavity and fill hole are in communication with each other and form the ink reservoir within the printhead. The ink holding capacity of the fill hole is larger than that of the recessed cavity. The fill hole is precisely formed and positioned within the heater plate by anisotropic etching. The structural member may be fabricated either from two layers of photoresist, a two-stage flat nickel electroform, or a single photoresist layer and a single stage flat nickel electroform.

Drop-on-demand thermal ink jet printheads discussed in the above patents are fabricated by using silicon wafers and processing technology to make multiple small heater plates and channel plates. This works extremely well for small printheads. However, for large array or pagewidth printheads, a monolithic array of ink channels or heater elements cannot be practically fabricated in a single wafer since the maximum commercial wafer size is six inches. Even if ten inch wafers were commercially available, it is not clear that a monolithic channel or heater element array would be very feasible. This is because only one defective channel or heater element out of 2,550 would render the entire channel or heater element plate useless. This yield problem is aggravated by the fact that the larger the silicon ingot diameter, the more difficult it is to make it defect-free. Also, relatively few 8½ inch channel or heater plate arrays could be fabricated in a ten inch wafer. Most of the wafer would be thrown away, resulting in very high fabrication costs.

The fabrication approaches for making either large array or pagewidth thermal ink jet printheads can be divided into basically two broad categories; namely, monolithic approaches in which one or both of the printhead components (heater substrate and channel plate substrate) are a single large array or pagewidth size, or sub-unit approaches in which smaller sub-units are combined to form the large array or pagewidth print bar. For an example of the sub-unit approach, refer to the abovementioned U.S. Pat. No. 4,612,554 to Poleshuk, and in particular to FIG. 7 thereof. The sub-unit approach may give a much higher yield of usable sub-units, if they can be formed with butt edges that are precisely aligned with respect to each other when butting one subunit against an adjacent subunit. The alignment problems for these separate units presents quite a formidable task, the prior art solution of which makes this type of large array very expensive.

One previous technique for forming butt edges, shown in FIGS. 1A–1B, involves orientation dependent etching a groove 10 on one surface of the wafer, placing a dice cut 11 in the opposite surface of the wafer and applying a force F to fracture break the wafer along line 12 into subunits to produce butt edges 13. Adjacent subunits are then butted together at the butt edges 13 (FIG. 1B). Disadvantages of this technique are: the fracture edges can produce cracked passivation up to 50 micrometers away, the butt edges 13 are razor edges which are easily damaged, and any difference in chip thickness between two subunits results in a slight lateral misalignment in addition to the height misalignment since the butting surfaces are at an angle to each other. This lateral shift is due to the angle of the (111) etched surfaces in silicon wafer subunits.

Another previous method, illustrated in FIGS. 2A and 2B, which requires only one through etch, involves making at least one through etch 20 on one surface of the wafer to define a first butt edge 21 and dividing the wafer into two subunits $S_1$, $S_2$ forming a trough 22 on the other surface of the wafer, and then making a dice cut 23 through the trough 22 to form a second butt edge 24. The first butt edge 21 of each subunit is butted against the second butt edge 24 of an adjacent subunit (FIG. 2B) to form the array. This method reduces the amount of etch time required and also reduces the butt edge area. This method also is susceptable to a lateral displacement of $0.7\Delta h$ due to differences in adjacent chip height $\Delta h$.

U.S. Pat. No. 4,814,296 to Jedlicka et al discloses a process for forming individual dies having faces that allow the dies to be assembled against other like dies to form one and/or two dimensional scanning arrays. The active side of a wafer is etched to form small V-shaped grooves defining the die faces, relatively wide grooves are cut in the inactive side of the wafer opposite each V-shape groove, and the wafer is cut by sawing along the V-shape grooves. The saw is located so that the side of the saw blade facing the die is aligned with the bottom of the V-shape groove so that there is retained intact one side of the V-shape groove to intercept and prevent cracks and chipping caused by sawing from damaging the die active surface and any circuits thereon. The process of Jedlicka et al does not make use of a resinoid blade for cutting through the upper surface of the wafer and consequently requires a V-shape groove to be formed in the upper surface to prevent cracks and chipping from damaging the active surface of the wafer and any circuits thereon. The process of Jedlicka et al also requires a portion of the wafer between adjacent subunits to be scrapped and thus does not optimize silicon real estate.

U.S. Pat. No. 4,786,357 to Campanelli et al discloses a method of fabricating a plurality of printheads for an ink jet printing device. The printheads are fabricated from two substrates, at least one of which is a (100) silicon wafer. A plurality of sets of heating element arrays are formed on one substrate, together with addressing electrodes for each heating element. A thick film insulative layer is placed over the heating element and addressing electrodes. This thick film is patterned to remove a portion thereof from over the individual heating elements, placing them each in a recess, and the terminal end portions of the electrodes including new contact pads therefor. A plurality of ink supplying manifold recesses are anisotropically etched in a silicon wafer and a plurality of sets of channel grooves are formed, each set of which communicate with an associated manifold. The silicon wafer and heating element substrates are aligned and bonded together, so that each channel groove contains a heating element. The individual printheads are formed by first removing unwanted silicon above each set of end portions of electrodes by a dicing operation and then dicing the heating element substrate to obtain the individual printheads. The method of Campanelli et al does not use a resinoid dicing blade and does not form a groove on a back side of either the heating element substrate or the silicon wafer substrate. Although Campanelli et al discloses a prior art method of dicing the silicon wafer by forming a groove on a lower surface of a silicon wafer having multiple channel subunits thereon, the cutting is not performed with a resinoid cutting blade and neither surface of the silicon wafer contains a circuit. Thus, Campanelli et al does not recognize the problems solved by the present invention let alone disclose or suggest the present invention.

U.S. Pat. No. 4,237,600 to Rosen et al. discloses a method for batch fabricating stacked semi-conductor devices wherein the stack consists of two diodes. Rosen et al. stack two silicon wafers on top of each other with metalized surfaces of each wafer abutting one another, etch through upper and lower surfaces of this conjoined structure to form upper and lower grooves and then cut through the upper and lower grooves to form a plurality of stacked semi-conductor diodes. Rosen et al. does not butt adjacent diodes against one another, does not form pagewidth printheads or use a resinoid blade for cutting.

U.S. Pat. No. 3,895,429 to Huang et al. discloses a method of making a semi-conductor device including the steps of forming a groove in a lower surface of a wafer, filling that groove in with a removable filling material and separating the wafer into subunits by cutting through the upper surface of the wafer above the groove. The step of cutting is performed while the removable filling material is still located within the groove. Huang et al. does not use a resinoid blade for cutting. Huang et al. does not recognize the advantage of using the lower surface groove for providing a clearance for the cutting blade since that groove is filled in during the cutting procedure.

U.S. Pat. No. 3,859,127 to Lehner discloses a method of producing mesa type semi-conductor devices having passivated mesa junctions. P and/or N type semi-conductor material is deposited on a silicon wafer, grooves are etched through the upper layers of silicon material, the substrate including the semi-conductor devices is passed through a chamber wherein a passivation layer is applied over the semi-conductor material and the substrate is cut at the location of the grooves to form a plurality of semi-conductor devices. The method of Lehner forms grooves on the upper surface of the substrate and does not disclose whether the cutting takes place through the groove or from the opposite surface of the wafer. Lehner does not teach or suggest the present invention or any of the benefits obtained thereby.

U.S. Pat. No. 3,913,217 to Misawa et al. discloses a method of producing semiconductor devices wherein grooves are etched through the upper surface of the wafer to define multiple semiconductor devices from a single wafer. A backing member is used to support the individual semiconductor devices after they are formed from the single wafer. Misawa et al. does not place the groove in the lower surface of the wafer and thus does not provide a clearance for a cutting blade. Although the wafer is additionally cut within the groove to separate into individual semi-conductor devices, it is not disclosed from which side this cut is made. Additionally a resinoid blade is not used.

U.S. Pat. No. 4,604,161 to Araghi discloses the previously discussed method in FIGS. 1A and 1B of forming butt edges on silicon wafer subunits by forming a groove in a lower surface of the wafer, etching a V-shape groove in an upper surface of the wafer, supporting the wafer on a fulcrum and causing the wafer to fracture into multiple pieces by applying a force to the upper surface thereof.

U.S. Pat. No. 4,237,601 to Woolhouse et al. discloses a method of forming multiple diode bars from a single wafer wherein grooves are formed on the lower surface of the wafer and the wafer is separated into multiple diodes by mechanical cleaving. The cleaving can be done by applying a force to the wafer such as by rolling the wafer over a small surface or by cutting through the groove from the groove side with a blade. Woolhouse et al. does not use a resinoid blade.

U.S. Pat. No. 3,706,129 to McCann discloses a process for forming semiconductive units wherein a set of parallel grooves are formed on one surface of a wafer, a second set of parallel grooves are formed on a second surface of the wafer, the second set of grooves being perpendicular to the first set of grooves and the wafer is subdivided along the grooves to form semiconductive units from the wafer. McCann does not disclose how the wafer is subdivided.

U.S. Pat. No. 3,972,133 to Nakada et al. discloses a process for producing semiconductor devices from a single wafer. Grooves are formed on upper and lower surfaces of a silicon wafer and the wafer is cut through the upper and lower grooves to form individual semiconductor devices.

OBJECTS OF THE INVENTION

An object of the present invention is to incorporate a backcut into a silicon wafer where it is diced to form wafer subunits (or chips) having butt edges so as to minimize the vertical surface contact between adjacent subunits when butting.

Another object of the present invention is to provide a method of forming butt edges on silicon wafer subunits with a cutting blade which causes substantially no damage to the circuit surface of the subunit.

Yet another object of the present invention is to provide a method of forming silicon wafer subunits having butt edges including a back cut where by debris (created during the cutting operation and/or existing as airborne particles) settles on a support surface in the space formed by the back cut during butting and does not interfere with the butting operation enabling assembly to take place in areas other than clean rooms.

Yet another object of the present invention is to provide a method of forming silicon wafer subunits whereby the upper surface of the silicon wafer can be cut without first forming a groove therein, thus conserving silicon real estate.

A further object of the present invention is to provide a method of forming arrays of wafer subunits having precision butt edges.

SUMMARY OF THE INVENTION

The present invention provides a method of forming wafer subunits having buttable edges which are obtained by forming a back cut in a base surface of a silicon wafer and then making a precision dice cut on the front surface of the wafer which intersects the back cut. The precision dice cut is made by a cutting blade which causes substantially no cracking of the passivation layer of the wafer thus obviating the need for a groove to be formed in the upper surface of the wafer prior to performance of the precision dice cut. A resinoid blade is the blade of choice although other blades capable of forming precision dice cuts without substantial cracking of the passivation layer of the wafer can also be used.

By this method, the back cut provides the bulk of the cut while the dice cut provides the precision delineation of the butt edge. By reducing the depth of the cut made by the dicing blade, the usable life of the blade is increased and the size of the blade required is reduced thus providing a more rigid blade which further increases cut quality. By making the dicing cut vertical, butt edges are formed which do not create lateral shifting of the upper circuit surfaces of the wafer subunits even when adjacent wafer subunits have differing thicknesses. The back cut also provides clearance for the dicing blade which reduces the damage to this blade since the blade enters the clearance and does not contact the support surface for the cutting operation. The clearance provided by the back cut also provides a space for passage of the non-linear portion of the cutting blade.

BRIEF DESCRIPTION OF THE DRAWINGS

A preferred embodiment of the invention will be described in detail with reference to the following drawings in which like elements bear like reference numerals and wherein:

FIGS. 1A and 1B are side views illustrating a prior art method for separating a wafer into subunits and butting adjacent subunits together to form an array;

FIGS. 3A-3D are side views illustrating a series of fabrication steps in accordance with the present invention;

DETAILED DESCRIPTION OF THE PREFERRED EMBODIMENT

Figure 2A:
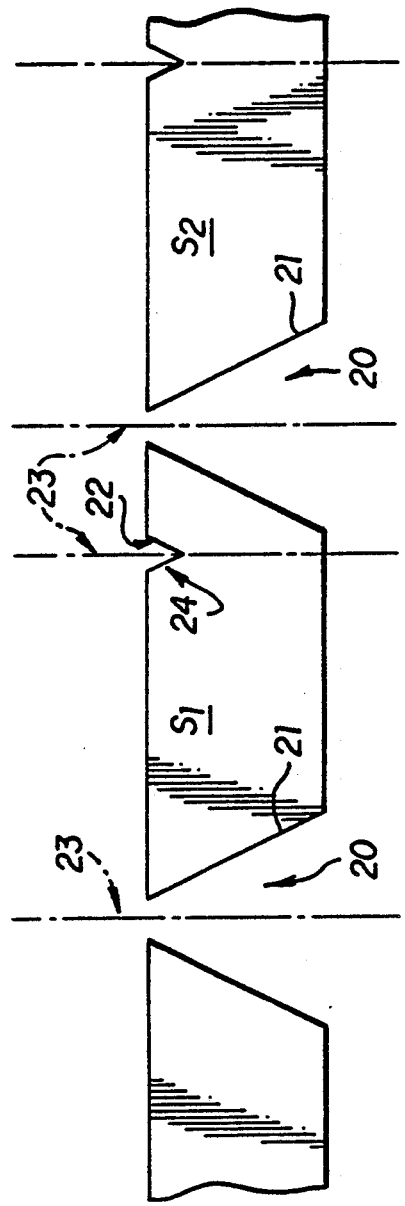
FIGS. 2A and 2B are side views illustrating another prior art method for separating a wafer into subunits and butting adjacent subunits together to form an array.
Figure 2B:
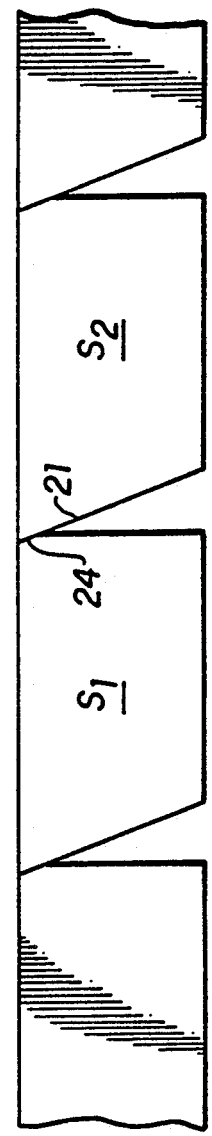

A method of fabricating an ink jet printhead formed from a linear array of butted subunits made by the present invention will now be described with reference to a "sideshooter" thermal ink jet printhead configuration. Although this is one preferred application of the present invention, it will be understood that it is not intended to limit the invention to a single embodiment. On the contrary, it is intended to cover all alternatives, modifications and equivalents as may be included within the spirit and scope of the invention as defined by the appended claims.

Referring particularly to FIG. 3A of the drawings and U.S. Pat. Nos. 4,601,777 and 4,774,530 (the disclosures of which are herein incorporated by reference), a side shooter printhead is composed of two substrates 10 and 20 which are bonded to one another. The lower substrate 20 (referred to as the heater plate) has on its circuit surface CS a series of heater arrays (not shown) with each individual heating element having an addressing electrode attached thereto. This lower substrate 20 also has a base surface BS1 which is substantially parallel to the circuit surface CS. The upper substrate 10 (referred to as a channel plate) has a base surface BS2 with a series of nozzles 30 formed therein, each nozzle communicating with a channel aligned above a heater element of the lower wafer when these two substrates 10, 20 are attached to one another. The upper wafer also has an upper surface US which is substantially parallel to the base surface BS2 containing the channels.

FIG. 3B shows a series of grooves or back cuts 40a, 40b, 40c formed through the base surface BS1 of the heater plate substrate 20. The back cuts 40a, 40b, 40c extend for a depth through the heater wafer which is less than the thickness of the heater plate substrate 20. Backcuts 40a, 40b, 40c have a predetermined depth which is a function of the type of wafer and wafter thickness. For a wafer having a thickness of 10-30 mils, the back cut depth can be 20-80% of the wafer thickness. Each back cut 40a, 40b, 40c can be formed by sawing, orientation dependent etching, or any other suitable operation that permits the back cuts 40a, 40b, 40c to be precisely located relative to the nozzles 30 in the channel plate substrate 10 and heater circuitry in the heater plate substrate 20. While three back cuts 40a, 40b, 40c are illustrated at unequal intervals in FIG. 3B, any number of back cuts 40 may be used at equal or unequal intervals depending on the location of the nozzles and circuitry in the channel and heater substrates 10, 20. As will become evident from the following description, the substrate portion between back cuts 40b and 40c will not be used in the subsequent butted array, and thus will form a waste product or scrap from the assembly operation. Scrap can be minimized by judicious placement of the back cuts relative to the nozzles and circuitry, as recognized by those skilled in the art.

After the back cuts 40a, 40b, 40c are formed on the base surface BS1 of each subunit, the printhead 10 is mounted on a support surface 50 (FIG. 3C) so that precision section cuts can be made therethrough. One type of support surface is an adhesive pad which contacts the base surface BS1 of the printhead. Section cuts 60a, 60b, 60c are then made through the upper surface US of the channel plate substrate 10 and extend through the heater plate substrate 20 so as to intersect each back cut 40a, 40b, 40c. The section cuts 60a, 60b, 60c are precisely located relative to the nozzles 30 and heater circuitry in the channel and heater substrates 10, 20. Since the back cuts 40a, 40b, 40c provide a clearance for the cutting blade, the section cuts 60a, 60b, 60c can be made without the cutting blade coming into contact with the adhesive layer on support surface 50. That is, the cutting blade which cuts the section cuts 60a, 60b, 60c penetrates the substrate to intersect the back cuts 40a, 40b, 40c without having to travel through the base surface BS1. This prevents the cutting blade from becoming gummed in the adhesive pad of the support surface 50 which would otherwise greatly reduce the life of the cutting blade and the cut quality.

Section cuts 60a, 60b, 60c separate the printhead 10 into a plurality of printhead subunits 10A, 10B, each having precisely located butt edges 70. (The portion of printhead between section cuts 60b, and 60c is scrap). As illustrated in FIG. 3D, the printhead subunits 10A, 10B are butted together at their adjacent butt edges 70 to form an array of precisely aligned subunits, preferably a pagewidth array. While subunits 10A and 10B are illustrated as derived from the same printhead, it is recognized by those skilled in the art that a plurality of subunits from different printheads can be formed from the process of FIG. 3C and comingled in a common storage bin for subsequent retrieval, such that a subunit from one printhead (having a back cut of one depth) may be butted against a subunit from a different printhead (having a back cut of a different depth).

The inventive method provides several unobvious advantages. The back cut 40 removes the nonlinear portion of the section cut 60 used to produce the butting surface. That is, since the cutting edge of a blade is tapered from linear sides to a non-linear cutting edge, the blade must be extended beyond the surface being cut so that the remaining cut edges are linear. The clearance provided by back cut 40 allows the non-linear cutting edge of the cutting blade to be extended therein to form linear cut edges without the blade coming into contact with the support surface 50. Further, the back cut 40 provides the bulk of the cutting through the substrate 20, to minimize the depth of the section cut 60. Minimization of the depth of the section cut enables the use of smaller sized cutting blades. This increases the rigidity of the blade, thus increasing cut quality. Since a given blade will have to cut through less material than if no back cut were provided, the usable life of the blade will be increased. Additionally, reducing the depth of the section cut reduces the surface area of the resulting butting surface which decreases the probability that debris and airborne particles will contaiminate the butting surface, thereby enabling highly accurate butting operations to take place even outside of a clean room. The back cut 40 also minimizes the vertical surface contact between the butt edges 70 and eliminates lateral displacement due to diagonal or inclined surface contact.

Figure 4:
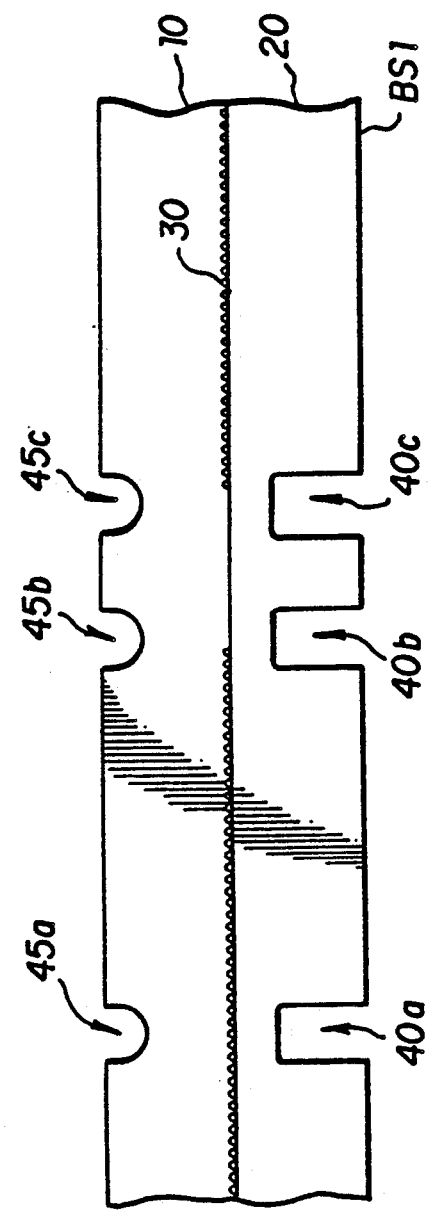
FIG. 4 is a side view illustrating an alternate embodiment of the present invention whereby the surface area of the butt edge is further reduced.

Vertical surface contact can be further minimized as illustrated in FIG. 4 (which is similar to FIG. 3B) by providing window cuts 45a, 45b, 45c in the upper surface US of the printhead 10 that are precisely aligned relative to the nozzles 30 and circuitry in the channel and heater substrates 10, 20 and are located above the back cuts 40a, 40b, 40c. The section cuts 60a, 60b, 60c would then extend between the window cuts 45a, 45b, 45c and the back cuts 40a, 40b, 40c to further minimize the surface of the butt edge 70. The window cuts 45a, 45b, 45c can be formed by any suitable method, such as sawing or orientation dependent etching. (As will become apparent herein, the window cuts 45a, 45b, 45c are intended to minimize vertical surface contact; they are not located in the upper surface to inhibit surface damage due to cutting, in a manner similar to the grooves 34 in U.S. Pat. No. 4,814,296). Another advantage is that the back cut provides a space S (FIG. 3D) between butted subunits into which debris D from the section cut or butting operations may collect without interfering with the butting operation.

One potential disadvantage of this procedure is the possible surface damage in the upper surface caused by the section cut or dicing operation. In a moderately controlled sawing operation, a minimum surface damage (passivation damage) zone is expected from the butt edge of approximately 10 μm, which could be a limiting factor to pixel resolution in diced buttable array.

To obviate this potential disadvantage, a resinoid cutting blade as described in U.S. Pat. Nos. 4,878,992; 4,822,755; and 4,851,371, the disclosures of which are herein incorporated by reference, is the blade of choice for performing the section cut 60 because it produces no substantial damage to the surfaces of the channel or heater substrates 10, 20. The terminology "no substantial damage" is meant to define a cutting blade which produces a section cut with no more than about 1 micrometer (1 μm) of cracking without the use of a groove on the upper surface of the substrate.

It was previously thought that a groove was required on the upper surface of a substrate in order to prevent substantial cracks caused by dicing blades from damaging the surface of the substrate. With previously used cutting blades, orientation dependent etched (ODE) grooves had to be formed on the surface to inhibit substantial cracking of the passivation layer or any circuits on the surface of the substrate had to be located a safe distance from the butt edge. See grooves 34 in U.S. Pat. No. 4,814,296 discussed above. A problem with forming ODE grooves is that they occupy valuable substrate real estate and create photoresist coverage problems. In addition, the further the circuit must be located from the butt edge, the lower the density of printhead nozzles. Even when upper surface grooves were formed with the prior art cutting blades, some cracking occurred on the subunit. By using a cutting blade which causes no substantial damage to the surface of the wafer, such as the preferred resinoid blade, such grooves can be eliminated and high density printheads can be fabricated without photoresist coverage problems. If grooves or window cuts 45 are employed as illustrated in FIG. 4, the window cuts 45 are intended to reduce vertical surface butting contact, and not to inhibit surface damage from dicing because such damage is minimized by the resinoid blade. Reduction of the vertical butting surface contact reduces the amount of misalignment caused by section cuts which are not perfectly vertical (possibly due to bending of the cutting blade during cutting). Additionally, the service life of the resinoid blade can be extended because the resinoid blade will not penetrate into the adhesive support surface 50 due to the presence of the back cut, as previously discussed with reference to FIG. 3C. Provision of the window cuts reduces the thickness of material which must be cut permitting the use of smaller blades. Since smaller blades can be made more rigid than larger blades having a similar width, the likelihood of the blade bending during the cutting procedure is reduced, thus increasing the cut quality. By reducing the amount of material which must be cut, the service life of the cutting blade is increased.

Similarly, one of ordinary skill in the art would understand that if the present invention is used to form butt edges on scanning arrays, the backcut is made on the lower surface of the scanning array wafer and the section cut is made on the circuit surface of the same wafer.

The invention has been described with reference to the preferred embodiments thereof, which are illustrative and not limiting. Various changes may be made without departing from the spirit and scope of the invention as defined in the following claims.

What is claimed is:

1. A method of fabricating a buttable edge surface in a substrate having an upper surface and a base surface, the method comprising the steps of:
   sawing at least one back cut of a predetermined depth in the base surface of the substrate; and
   cutting at least one section cut through the upper surface to intersect the corresponding at least one back cut without forming a surface passivation damage-inhibiting groove in the upper surface prior to cutting the section cut, the location of the section cut defining the buttable edge surface of the substrate.

2. A method of fabricating a printhead formed from a linear array of butted subunits comprising the steps of:
   forming at least one back cut of a predetermined depth in a base surface of a substrate;
   dividing the substrate into at least two subunits by cutting at least one section cut through an opposite upper surface of the substrate to intersect the corresponding at least one back cut without forming a surface passivation damage-inhibiting groove in the upper surface of the substrate prior to cutting the section cut, said at least one section cut forming a buttable edge surface in each subunit; and
   butting the buttable edge surface of each subunit against a corresponding buttable edge surface of an adjacent subunit to form said linear array.

3. The method of claim 2 wherein the substrate includes a channel substrate bonded on top of a heater substrate.

4. The method of claim 3 wherein the back cut formed in the base surface of the substrate is located in a base surface of the heater substrate.

5. The method of claim 4 wherein the predetermined depth of the back cut in the heater substrate is less than the thickness of the heater substrate.

6. The method of claim 2 wherein the width of the back cut is greater than the width of the section cut.

7. The method of claim 2 wherein the section cut is perpendicular to the upper surface to form a vertical buttable edge surface.

8. The method of claim 2 further comprising the step of collecting debris in the back cut while butting adjacent buttable edge surfaces.

9. The method of claim 2 wherein the back cut provides a clearance for a cutting blade which cuts the section cut.

10. The method of claim 2 further comprising the steps of locating the base surface of the substrate on a support surface after sawing the at least one back cut in the substrate; and using a cutting blade to cut the at least one section cut to depth that intersects the back cut without intersecting the support surface.

11. The method of claim 10 wherein the base surface is adhered to the support surface with an adhesive layer, and the back cut provides a clearance for the cutting blade between the section cut and the adhesive layer to eliminate penetration of the adhesive layer by the cutting blade.

12. The method of claim 10 wherein the cutting blade is a resinoid cutting blade.

13. The method of claim 2 wherein the back cut is formed by sawing the base surface of the substrate.

14. The method of claim 2 wherein the back cut is formed by etching the base surface of the substrate.

15. A method of fabricating a buttable edge surface in a substrate having an upper surface and a base surface, the method comprising the steps of:
sawing at least one back cut of a predetermined depth in the base surface of the substrate; and
cutting at least one section cut through the upper surface with a resinoid cutting blade to intersect the corresponding at least one back cut, the location of the section cut defining the buttable edge surface of the substrate.

16. A method of fabricating a printhead formed from a linear array of butted subunits comprising the steps of:
forming at least one back cut of a predetermined depth in a base surface of a substrate;
dividing the substrate into at least two subunits by cutting at least one section cut through an opposite upper surface of the substrate with a resinoid cutting blade to intersect the corresponding at least one back cut, said at least one section cut forming a buttable edge surface in each subunit; and
butting the buttable edge surface of each subunit against a corresponding buttable edge surface of an adjacent subunit to form said linear array.

17. The method of claim 16 wherein the substrate includes a channel substrate bonded on top of a heater substrate.

18. The method of claim 17 wherein the back cut formed in the base surface of the substrate is located in a base surface of the heater substrate.

19. The method of claim 18 wherein the predetermined depth of the back cut in the heater substrate is less than the thickness of the heater substrate.

20. The method of claim 16 wherein the width of the back cut is greater than the width of the section cut.

21. The method of claim 16 wherein the section cut is perpendicular to the upper surface to form a vertical buttable edge surface.

22. The method of claim 16 further comprising the step of collecting debris in the back cut while butting adjacent buttable edge surfaces.

23. The method of claim 16 wherein the back cut provides a clearance for the resinoid cutting blade which cuts the section cut.

24. The method of claim 16 further comprising the steps of locating the base surface of the substrate on a support surface after sawing the at least one back cut in the substrate; and using the resinoid cutting blade to cut the at least one section cut to a depth that intersects the back cut without intersecting the support surface.

25. The method of claim 24 wherein the base surface is adhered to the support surface with an adhesive layer, and the back cut provides a clearance for the resinoid cutting blade between the section cut and the adhesive layer to eliminate penetration of the adhesive layer by the resinoid cutting blade.

26. The method of claim 16 wherein the back cut is formed by sawing the base surface of the substrate.

27. The method of claim 16 wherein the back cut is formed by etching the base surface of the substrate.

28. The method of claim 15 wherein substantially no cracking of the upper surface of the substrate occurs during cutting through the upper surface.

29. The method of claim 16 wherein substantially no cracking of the upper surface of the subsbtrate occurs during cutting through the upper surface.

30. The method of claim 15 wherein a window cut is formed in the upper surface and aligned with the back cut prior to performing the section cut.

31. The method of claim 16 wherein a window cut is formed in the upper surface and aligned with the back cut prior to performing the section cut.

* * * * *